United States Patent
Chen et al.

(10) Patent No.: US 12,317,547 B2
(45) Date of Patent: May 27, 2025

(54) METHOD OF FABRICATING SEMICONDUCTOR DEVICE HAVING EPITAXIAL STRUCTURE

(71) Applicant: UNITED MICROELECTRONICS CORP., Hsin-Chu (TW)

(72) Inventors: Kuang-Hsiu Chen, Tainan (TW); Sung-Yuan Tsai, Yunlin County (TW); Chi-Hsuan Tang, Kaohsiung (TW); Chun-Wei Yu, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 99 days.

(21) Appl. No.: 18/218,098

(22) Filed: Jul. 4, 2023

(65) Prior Publication Data
US 2023/0352587 A1 Nov. 2, 2023

Related U.S. Application Data

(60) Continuation of application No. 17/330,443, filed on May 26, 2021, now Pat. No. 11,735,661, which is a division of application No. 16/205,233, filed on Nov. 30, 2018, now Pat. No. 11,049,971.

(30) Foreign Application Priority Data

Oct. 29, 2018 (CN) .......................... 201811267020.X

(51) Int. Cl.
H10D 30/69 (2025.01)
H10D 30/01 (2025.01)
(Continued)

(52) U.S. Cl.
CPC ....... *H10D 30/797* (2025.01); *H10D 30/0223* (2025.01); *H10D 62/151* (2025.01);
(Continued)

(58) Field of Classification Search
CPC . H01L 29/0843; H01L 29/0847; H01L 29/36; H01L 29/41783; H01L 29/42364;
(Continued)

(56) References Cited

U.S. PATENT DOCUMENTS 7,190,035 B2 3/2007 Ito
7,768,074 B2 8/2010 Golonzka
(Continued)

FOREIGN PATENT DOCUMENTS

| CN | 107527945 A | 12/2017 | |
|---|---|---|---|
| KR | 20170135510 A * | 12/2017 | ......... H01L 29/0847 |
| WO | WO-2017111914 A1 * | 6/2017 | ......... H01L 29/0607 |

*Primary Examiner* — Matthew E Warren
(74) *Attorney, Agent, or Firm* — Winston Hsu

(57) ABSTRACT

A semiconductor device and a method of forming the same, the semiconductor device includes a substrate, a gate structure and an epitaxial structure. The gate structure is disposed on the substrate, and the epitaxial structure is disposed in the substrate, at one side of the gate structure. The epitaxial structure includes a portion being protruded from a top surface of the substrate, and the portion includes a discontinuous sidewall, with a distance between a turning point of the discontinuous sidewalls and the gate structure being a greatest distance between the epitaxial structure and the gate structure.

12 Claims, 5 Drawing Sheets

(51) Int. Cl.
*H10D 62/13* (2025.01)
*H10D 62/60* (2025.01)
*H10D 64/01* (2025.01)
*H10D 64/27* (2025.01)

(52) U.S. Cl.
CPC ........... *H10D 62/60* (2025.01); *H10D 64/015* (2025.01); *H10D 64/021* (2025.01); *H10D 64/514* (2025.01)

(58) Field of Classification Search
CPC ............. H01L 29/6653; H01L 29/6656; H01L 29/66575; H01L 29/66636; H01L 29/7845; H01L 29/7848; H10D 30/0223; H10D 30/797; H10D 62/60; H10D 62/151; H10D 64/015; H10D 64/021; H10D 64/514
See application file for complete search history.

(56) References Cited

U.S. PATENT DOCUMENTS

| | | |
|---|---|---|
| 8,476,169 B2 | 7/2013 | Yang |
| 8,722,501 B2 | 5/2014 | Tsai |
| 8,754,448 B2 | 6/2014 | Liao |
| 8,796,695 B2 | 8/2014 | Liao |
| 9,184,100 B2 | 11/2015 | Tsai |
| 9,536,962 B1 | 1/2017 | Fan |
| 9,716,165 B1 | 7/2017 | Lin |
| 9,985,036 B2* | 5/2018 | Shin ................... H01L 29/66575 |
| 2005/0035407 A1* | 2/2005 | Koh ..................... H01L 29/7834 257/E29.267 |
| 2011/0230027 A1* | 9/2011 | Kim .................... H01L 29/7834 438/285 |
| 2013/0240956 A1 | 9/2013 | Hou |
| 2015/0200299 A1 | 7/2015 | Chen et al. |
| 2015/0206945 A1 | 7/2015 | Chen |
| 2015/0349088 A1* | 12/2015 | Wei ....................... H01L 29/165 438/286 |
| 2016/0049332 A1 | 2/2016 | Xie |
| 2017/0186869 A1 | 6/2017 | Shin et al. |
| 2017/0294508 A1* | 10/2017 | Hsu ..................... H01L 29/0847 |
| 2018/0190809 A1 | 7/2018 | Huang |
| 2019/0172752 A1* | 6/2019 | Hsu ..................... H01L 21/31144 |
| 2020/0083100 A1* | 3/2020 | Tsai ..................... H01L 29/7848 |
| 2020/0135476 A1* | 4/2020 | Huang ................ H01L 29/7833 |

* cited by examiner

METHOD OF FABRICATING SEMICONDUCTOR DEVICE HAVING EPITAXIAL STRUCTURE

CROSS REFERENCE TO RELATED APPLICATIONS

This application is a continuation application of U.S. application Ser. No. 17/330,443, filed on May 26, 2021, which is a division of U.S. application Ser. No. 16/205,233, filed on Nov. 30, 2018. The contents of these applications are incorporated herein by reference.

BACKGROUND OF THE INVENTION

1. Field of the Invention

The present invention generally relates to the field of a semiconductor device and a method of forming the same, and more particularly to a semiconductor device having an epitaxial structure and a method of forming the same.

2. Description of the Prior Art

For the sake of increasing the carrier mobility of the semiconductor structure, a compressive stress or tensile stress can be optionally applied to the gate channel. In conventional arts, a selective epitaxial growth (SEG) process is used to form a compressive stress. For example, after the formation of a gate on a silicon substrate, a silicon-germanium (SiGe) epitaxial structure is formed in the predetermined location, in which the lattice arrangement of silicon (Si) and germanium (Ge) are similar to each other. Since the lattice constant of the SiGe layer is larger than a lattice constant of Si, accordingly, the band structure of Si may be changed, and the compressive stress is then formed and applied to the channel region of a PMOS transistor, thereby increasing the carrier mobility in the channel region, as well as increasing the efficiency of the PMOS transistor. On the other hand, a silicon carbide (SiC) epitaxial structure can be optionally formed in the silicon substrate of a NMOS transistor, to apply the tensile stress to the channel region of the NMOS transistor.

While the foregoing method can improve the carrier mobility in the channel region, said method also has led to the difficulty of the overall fabrication process and the process control, especially under the trend of miniaturization of semiconductor device dimensions. Hence, there is a need of proving a novel fabrication method of a semiconductor device, to obtain more reliable semiconductor device.

SUMMARY OF THE INVENTION

One object of the present invention is to provide a semiconductor device and a method of forming the same, in which, the epitaxial structure is separated from the gate structure by a certain distance at a portion thereof protruded from a top surface of the substrate. That is, the electrical performance of the semiconductor device may no longer be affected thereby.

To achieve the purpose described above, the present invention provides a semiconductor device including a substrate, a gate structure and an epitaxial structure. The gate structure is disposed on the substrate and an epitaxial structure is disposed in the substrate, at one side of the gate structure. The epitaxial structure comprises a portion being protruding from a top surface of the substrate, and the portion comprises a discontinuous sidewall, with a distance between a turning point on the discontinuous sidewall and the gate structure being a maximum distance between the epitaxial structure and the gate structure.

To achieve the purpose described above, the present invention provides a method of forming a semiconductor device including the following steps. Firstly, a substrate is provided, and a gate structure is formed on the substrate. Then, an epitaxial structure is formed in the substrate, at one side of the gate structure, the epitaxial structure comprises a portion being protruding from a top surface of the substrate, and the portion comprises a discontinuous sidewall, with a distance between a turning point on the discontinuous sidewall and the gate structure being a maximum distance between the epitaxial structure and the gate structure.

In summary, the method of the present invention utilizes two deposition layers formed in the two deposition processes to respectively define the profile of the portion of the epitaxial structure protruded from the substrate or the fin structure. That is, the portion of the epitaxial structure may therefore obtain a discontinuous sidewall, and a distance between a turning point on the discontinuous sidewall and the adjacent gate structure may be a maximum distance between the epitaxial structure and the gate structure. Preferably, the maximum distance may be adjacent to the top surface of the substrate or the fin structure as much as possible, with the maximum distance being about 200 angstroms or more than 200 angstroms. In this way, it is sufficient to avoid the arrangement of the epitaxial structure getting interference with the current-intensive regions such as a light doped source/drain region in the substrate or the fin structure, at both two sides of the gate structure, so as to gain a better performance and functions to the semiconductor device of the present invention.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 are schematic diagrams illustrating a method of forming a semiconductor device according to a first preferred embodiment of the present invention, in which:

FIG. 1 shows a cross-sectional view of a semiconductor device at the beginning of the forming process;

FIG. 2 shows a cross-sectional view of a semiconductor device after forming an epitaxial layer;

FIG. 3 shows a cross-sectional view of a semiconductor device after forming a deposition material layer;

FIG. 4 shows a cross-sectional view of a semiconductor device after performing an etching process;

FIG. 5 shows a cross-sectional view of a semiconductor device after forming another epitaxial layer; and FIG. 6 shows a cross-sectional view of a of a semiconductor device after forming an epitaxial structure.

FIG. 7 to FIG. 8 are schematic diagrams illustrating a method of forming a semiconductor device according to a second preferred embodiment of the present invention, in which:

FIG. 7 shows a cross-sectional view of a semiconductor device after forming an epitaxial layer; and FIG. 8 shows a cross-sectional view of a semiconductor device after forming an epitaxial structure.

DETAILED DESCRIPTION

Figure 1:
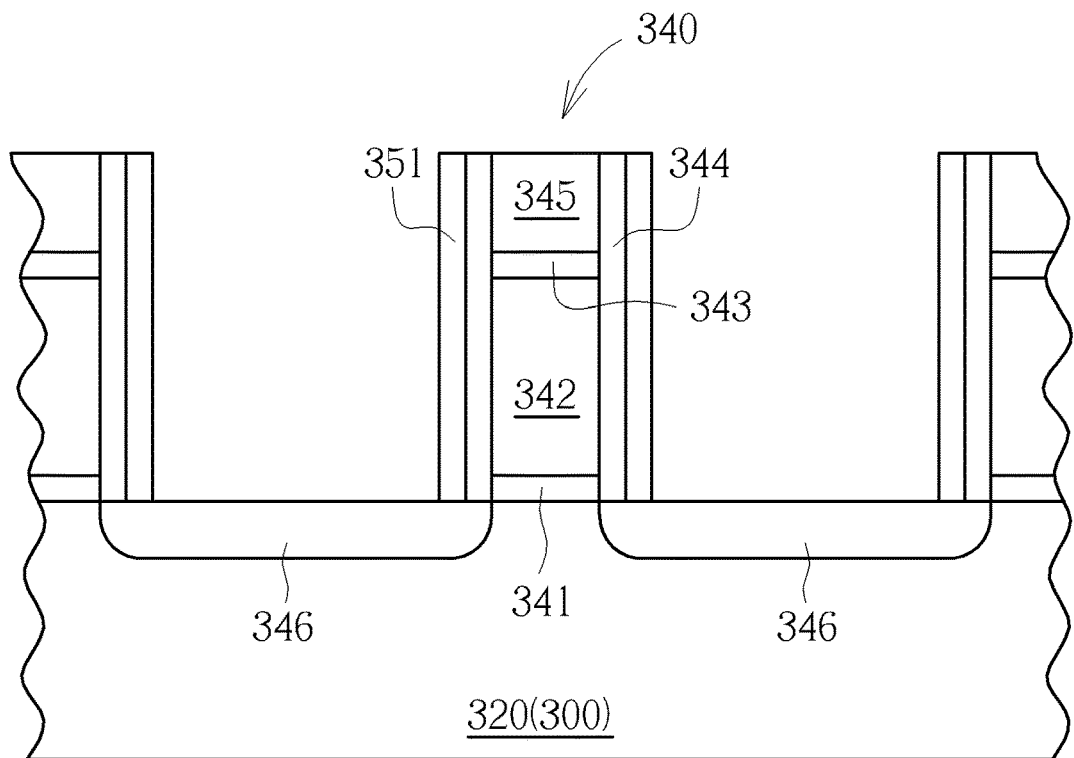

To provide a better understanding of the present invention, preferred embodiments will be described in detail. The preferred embodiments of the present invention are illustrated in the accompanying drawings with numbered elements.

Referring to FIGS. 1-6, FIGS. 1-6 illustrate a method of forming a semiconductor device according to the first preferred embodiment of the present invention. In the present embodiment, a substrate 300, such as a silicon substrate, an epitaxial layer, a silicon germanium substrate, a silicon carbide substrate or silicon on insulator (SOI) substrate, is provided. Furthermore, a fin structure 320 may be firstly formed in the substrate 300, for example through a general photolithography-etching process (PEP) or a multi-patterning process, to make the substrate 300 as a nonplanar substrate, but not limited thereto. In another embodiment, the fin structure 320 may also be omitted, to directly provide a planar substrate (not shown in the drawings).

Then, at least one gate structure 340 is formed on the substrate 300, across the fin structure 320. In the present embodiment, although three gate structures 340 are formed on one fin structure 320 as an example, the practical number of the gate structure 340 and the fin structure 320 is not limited thereto and may further be adjustable according to the product requirements. For example, one or more than one gate structure 340 may also be formed across the same fin structure 320. Precisely, each of the gate structure 340 includes a stacked structure (not shown in the drawings) and a spacer 344 surrounding the stacked structure, and the stacked structure includes a gate dielectric layer 341 such as including silicon oxide, a gate layer 342 such as including polysilicon or amorphous silicon, a capping layer 343 such as including silicon oxide, silicon nitride or silicon oxynitride (SiON), and a mask layer 345 such as silicon carbonitride (SiCN) stacked on one over another. In one embodiment, the formation of the gate structure 340 may be accomplished by sequentially forming a dielectric material layer (not shown in the drawings), a gate material layer (not shown in the drawings), a capping material layer (not shown in the drawings) and a mask material layer on the substrate 300, and patterning the aforementioned material layers to form the stacked structure. Next, a light doped source/drain region 346 is formed at two sides of the stacked structure in the fin structure 320, and the spacer 344 such as including silicon oxide is then formed on sidewalls of the stacked structure, thereby forming the gate structure 340. In the present embodiment, although the spacer 344 is exemplify by having a monolayer structure, the practical structure thereof is not limited thereto and may further be adjustable according to the product requirements. In another embodiment, a spacer (not shown in the drawings) having a multilayer structure may also be formed.

Then, a deposition process is performed, to additionally form a deposition layer 351 on the spacer 344 of each of the gate structures 340. In one embodiment, the deposition layer 351 for example includes a material having an etching selectivity related to that of the spacer 344, such as silicon nitride or silicon carbonitride. At first, the deposition layer 351 is entirely deposited on the fin structure 320 (namely the substrate 300), to cover a top surface of the fin structure 320 and each gate structure 340, and then, an etching back process is performed to form the deposition layer 351 as shown in FIG. 1.

Figure 2:
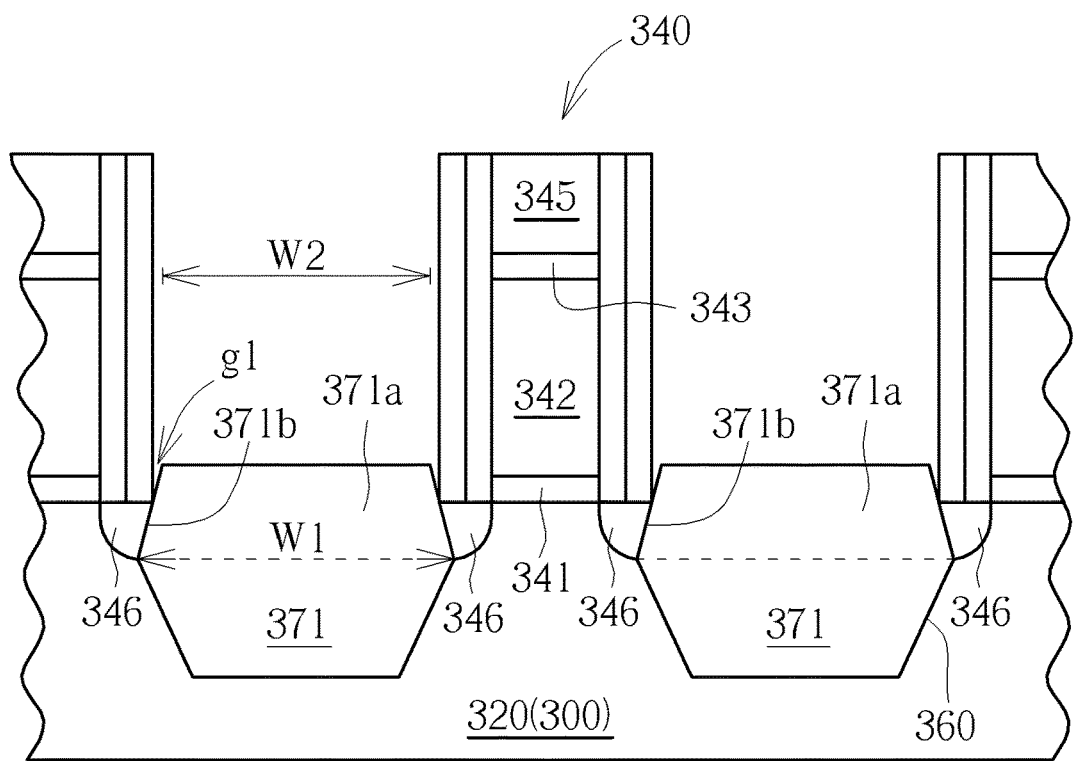

Next, an epitaxial structure 370 is formed in the fin structure 320 at two sides of each gate structure 340, to serve as a source/drain region. Firstly, an etching process such as a dry etching, a wet etching or a sequent performed dry and wet etching process is firstly performed, to form at least one recess 360 in the fin structure 320 at two sides of each gate structure 340, and a selectivity epitaxial growth (SEG) process is formed in the recess 360, to form an epitaxial layer 371 being protruded from the top surface of the fin structure 320. It is noted that, the epitaxial layer 371 defines a formation position through the deposition layer 351 in advance, so that, the epitaxial layer 371 may therefore have a gradually shrinking portion 371a being gradually shrunk upwardly to at least partially protrude from the top surface of the fin structure 320, as shown in FIG. 2. Precisely, the gradually shrinking portion 371a has a tapered sidewall 371b, and the tapered sidewall 371b is continuously tapered along a direction being away from the gate structure. That is, the tapered sidewall 371b is gradually away from the deposition layer 351 to not in contact with the deposition layer 351 directly, and the gradually shrinking portion 371a may obtain a width (not shown in the drawings) being continuously expanded downwardly. In other words, a bottom surface (not shown in the drawings) of the gradually shrinking portion 371a has a width W1 being greater than a width W2 (not shown in the drawings) of a top surface of the gradually shrinking portion 371a. Through this arrangement, a gap g1 may be further interposed between the deposited layer 351 and one side of the epitaxial layer 371 adjacent to the deposited layer 351.

The epitaxial layer 371 includes a material which may be adjusted according to the type of the MOS transistor formed in the subsequent steps. For example, the epitaxial layer 371 may include silicon germanium (SiGe) or silicon carbide (SiC), but not limited thereto. Also, according to the conductive type of the MOS transistor formed in the subsequent steps, a suitable P-type dopant or a suitable N-type dopant may be implanted either through an in-situ implanted process while performing the SEG process, or through an additionally performed ion implantation process before or after the SEG process. For example, in the present embodiment, a PMOS transistor is formed while the epitaxial layer 371 includes silicon germanium with in-situ implanted a particular concentration of boron (B), but not limited thereto.

Figure 3:
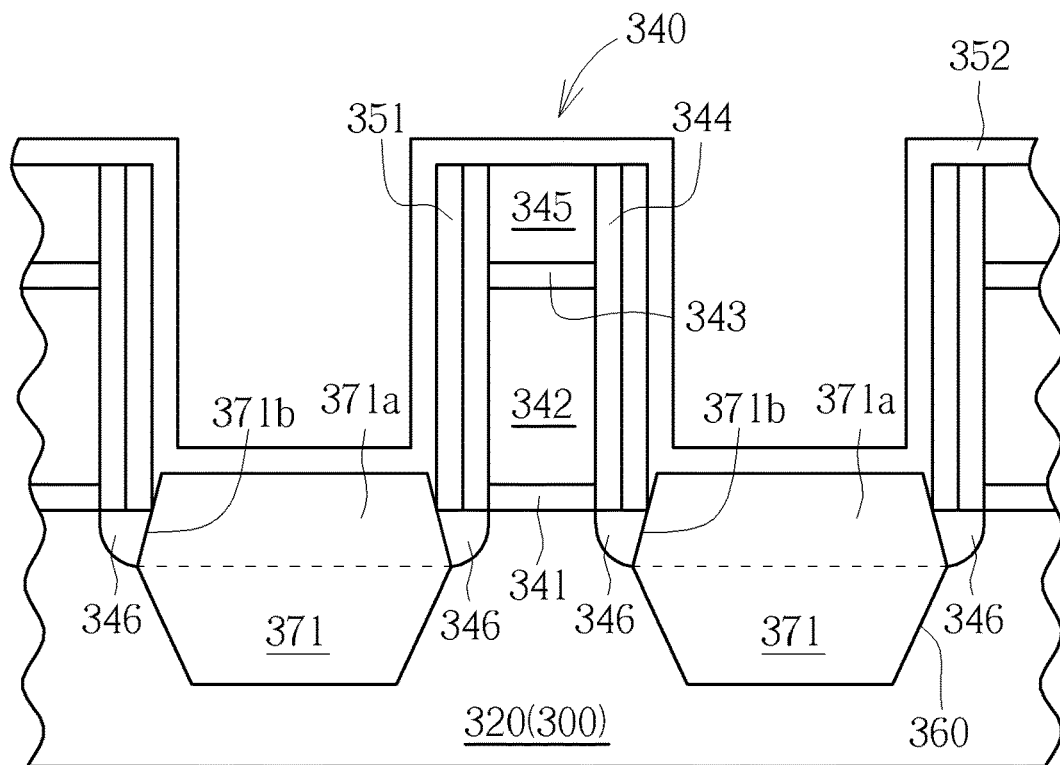
Figure 4:
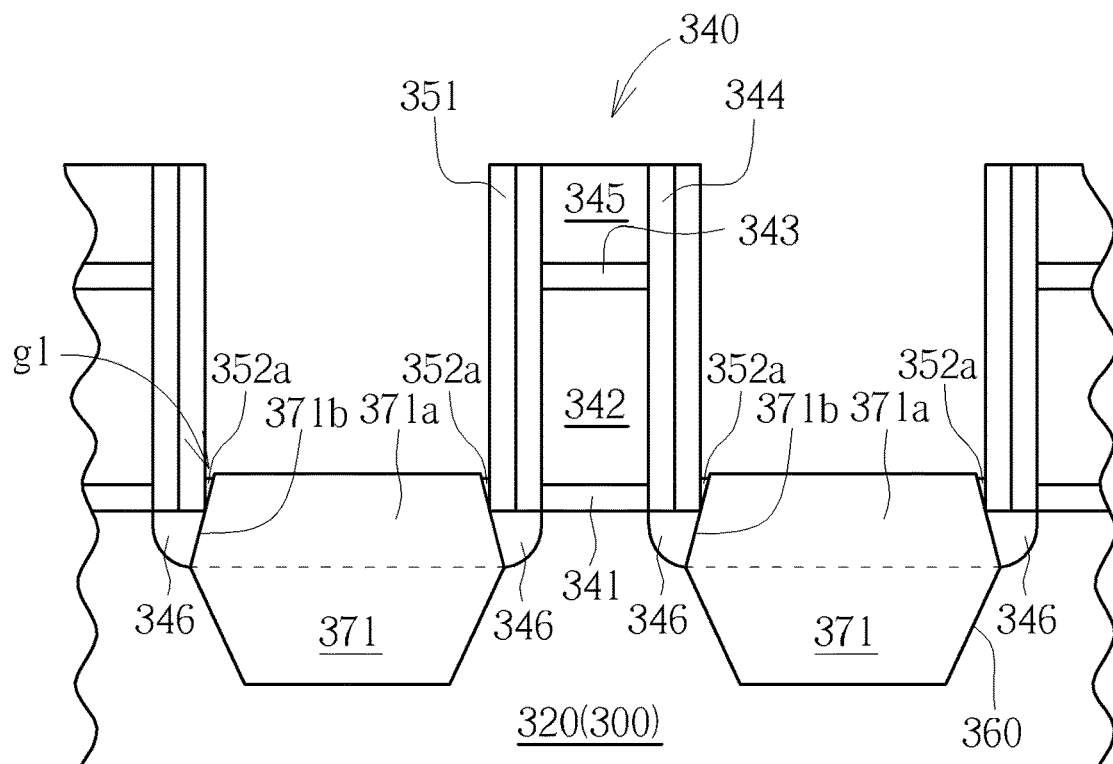

Then, another deposition process is performed, to additionally form a deposition material layer 352 on each gate structure 340, to entirely cover the top surface of the fin structure 320 (namely the substrate 300), each gate structure 340 and the epitaxial layer 371, as shown in FIG. 3. In the present embodiment, the deposition material layer 352 preferably includes a same material as that of the deposition layer 351, for example both including silicon nitride, and the deposition material layer 352 preferably includes a relative greater thickness (not shown in the drawings) than that of the deposition layer 351, such as being about 90-100 angstroms, to fill up the gap g1 and to further cover on the top surface of the epitaxial layer 371. After that, another etching back process such as a dry etching process is performed, to remove most of the deposition material layer 352 to form a deposition layer 352a for exposing the top surface of the epitaxial layer 371. In the present embodiment, the deposition material layer 352 is preferably removed until being lower than the top surface of the epitaxial layer 371, as shown in FIG. 4. That is, the deposition layer 352a may only partially fill up the gap g1 between the epitaxial layer 371 and the deposition layer 351, but not limited thereto. In another embodiment, the deposition material layer 352 may also be removed until being coplanar with the top surface of the epitaxial layer 371, so that, a deposition layer (not shown in the drawings) formed thereby may barely fill up the gap g1 between the epitaxial layer 371 and the deposition layer 351.

Figure 5:
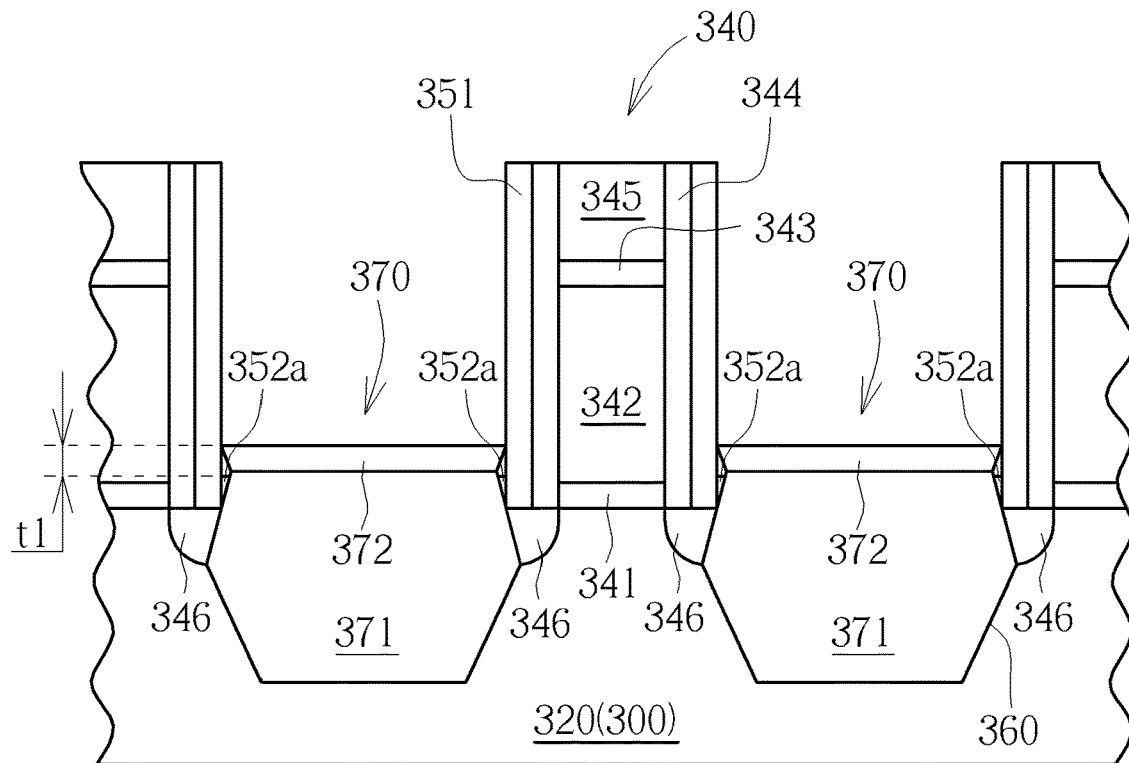
Figure 6:
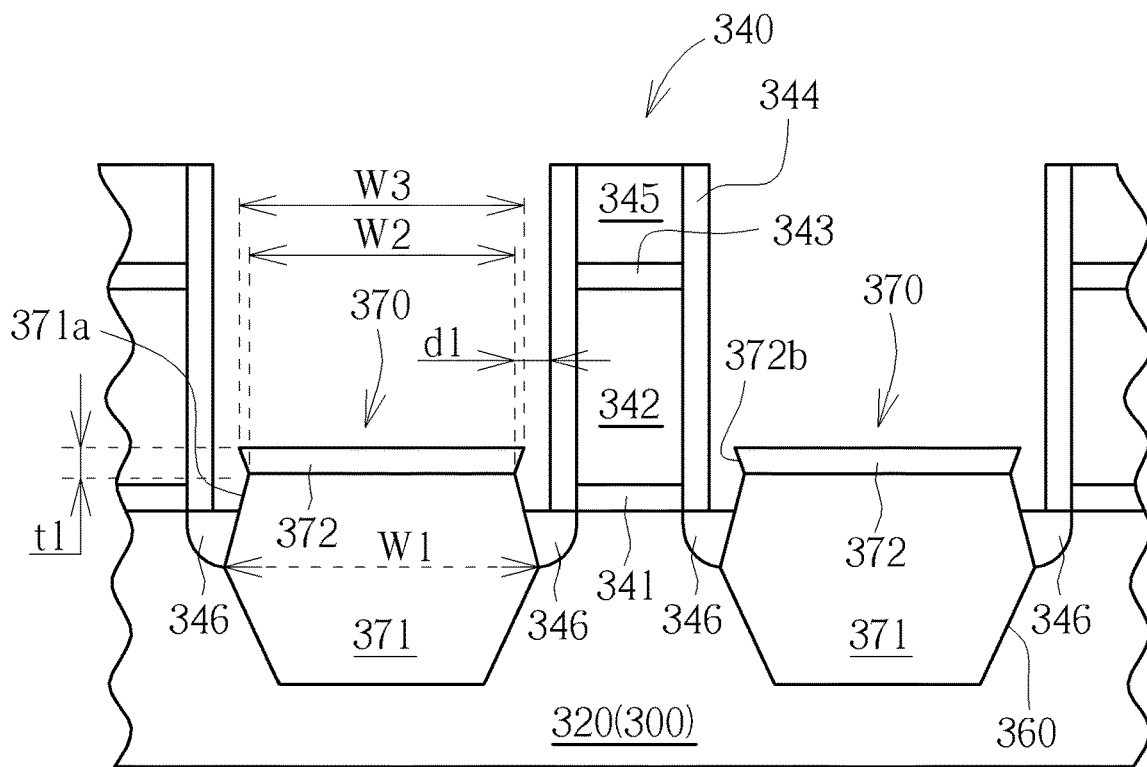

Following these, another SEG process is performed from the top surface of the epitaxial layer 371, to form an epitaxial layer 372 having a uniform thickness t1 entirely. In the present embodiment, the epitaxial layer 372 is grown from the top surface of the epitaxial layer 371 which is exposed from the deposited layer 352a, so that, the entire epitaxial layer 372 is gradually expanded upwardly to perform like a gradually expanding portion. The gradually expanding portion also includes a tapered sidewall 372b, and the tapered sidewall 372b is continuously tapered along a direction being toward the gate structure 340. That is, the gradually expanding portion may obtain a width (not shown in the drawings) being continuously expanded upwardly, as shown in FIGS. 5-6. In other words, a top surface (not shown in the drawings) of the gradually expanding portion (the epitaxial layer 372) has a width W3 being greater than the width W2 of a bottom surface (not shown in the drawings) of the gradually expanding portion, which is the same as that of the top surface of the gradually shrinking portion 371a as shown in FIG. 2, and the width W3 of the top surface of the gradually expanding portion is smaller than the width W1 of the bottom surface of the gradually shrinking portion 371a. Furthermore, the epitaxial layer 372 also includes a material and a dopant which may be adjusted according to the type of the MOS transistor formed in the subsequent steps, and the material and the dopant of the epitaxial layer 372 are preferably the same as that of the epitaxial layer 371. In other words, the epitaxial layer 372 of the present embodiment may also include silicon germanium with in-situ implanted a particular concentration of boron, and a doped concentration of boron in the epitaxial layer 372 is preferably greater than that of the epitaxial layer 371.

Then, an etching process is perform to completely remove the remained deposition layer 352a and the deposition layer 351, so that, the epitaxial layer 372 and a upper portion of the epitaxial layer 371 protruded from the top surface of the fin structure 320 (namely the substrate 300) may be further away from the gate structures 340 on both two sides, with a gap between the gate structure 340 and the position of the epitaxial layers 371, 372 adjacent to the top surface of the fin structure 320 being pulled apart by about 200 angstroms, as shown in FIG. 6. Accordingly, the epitaxial layers 371, 372 may together form the epitaxial structure 370, thereby to configure as a source/drain region (not shown in the drawings) of the MOS transistor formed in the subsequent steps. Precisely, a portion of the epitaxial layer 370 protruded from the top surface of the fin structure 320 (namely the substrate 300) is consisted of the epitaxial layer 372 and a portion of the epitaxial layer 371 (namely a portion of the gradually shrinking portion 371a), and the epitaxial layer 372 and the portion of the epitaxial layer 371 include the continuously tapered sidewalls 372b, 371b respectively. That is, the portion of the epitaxial layer 370 protruded from the top surface of the fin structure 320 may obtain a discontinuous sidewall (not shown in the drawings) thereby. A lower portion of the discontinuous sidewall is namely the sidewall 371b of the epitaxial layer 371 (the gradually shrinking portion 371a). As the formation of the sidewall 371b is limited by the deposition layer 351, the sidewalls 371b is continuously tapered away from the gate structure 340. On the other hand, an upper portion of the discontinuous sidewall is namely the sidewall 372b of the epitaxial layer 372 (namely the gradually expanding portion), and the sidewall 372b is continuously tapered toward the gate structure 340 due to being formed through the exposed top surface of the epitaxial layer 371, as shown in FIG. 6. With this performance, a distance between the adjacent gate structure 340 and a turning point (not shown in the drawings) being between the epitaxial layer 371 (the gradually shrinking portion) and the epitaxial layer 372 (the gradually expanding portion), may be a maximum distance d1 between the epitaxial structure 370 and the adjacent gate structure 340, for example being about 200-250 angstroms, as shown in FIG. 6. Also, in one embodiment, the maximum distance is preferably adjacent to the top surface of the fin structure 320 (substrate 300) as closer as possible, so as to pull apart the distance on the fin structure 320, between the epitaxial structure 370 and the gate structure 340. In this way, it is sufficient to avoid the arrangement of the epitaxial structure 370 getting interference with the current-intensive regions such as the light doped source/drain region 346 in the fin structure 320, at both two sides of the gate structure 340.

Accordingly, the semiconductor device of the first preferred embodiment is obtained. The forming method of the present embodiment mainly uses two deposition layers 351, 352 formed by two deposition processes to respectively define the formation of the portion of the epitaxial structure 370 protruded from the substrate 300, to pull apart the distance between the epitaxial structure 370 and the gate structure 340 as much as possibly, with the gap between the gate structure 340 and the position of the epitaxial structure 370 adjacent to the top surface of the substrate 300 being pulled apart by about 200 angstroms. That is, the performance of the semiconductor device may be improved by avoiding the arrangement of the epitaxial structure 370 getting interference with the current-intensive regions (such as the light doped source/drain region 346) in the substrate 300, at both two sides of the gate structure 340.

However, people in the art should easily understand that the forming method of the present invention is not limited to the aforementioned embodiment and may further include other examples, so as to meet the requirements of the practical products. The following description will detail the different embodiments of the forming method of the semiconductor device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 7:
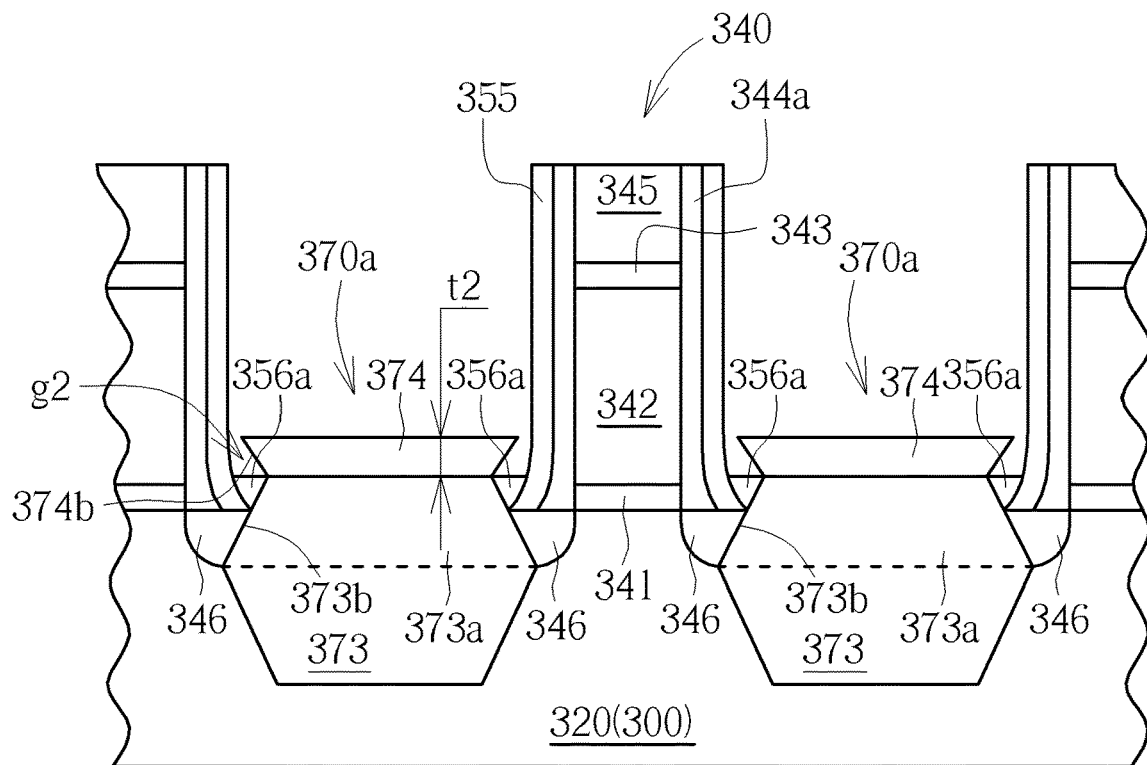
Figure 8:
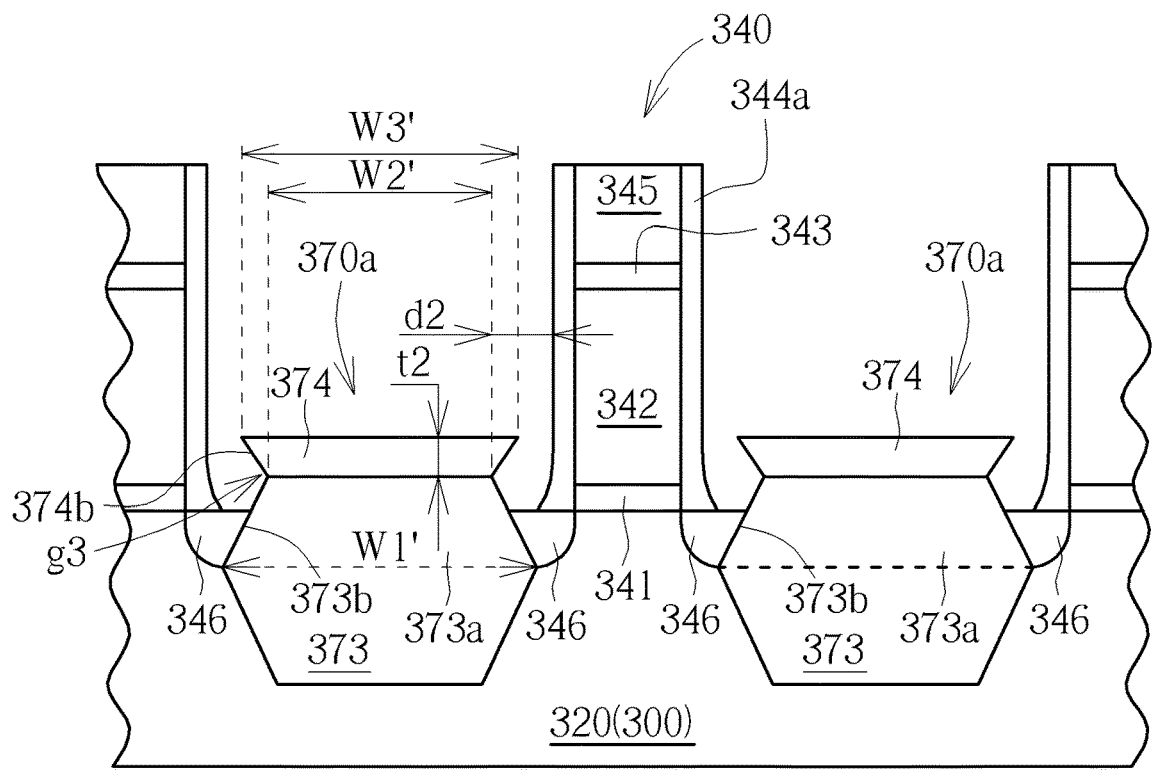

Please refers to FIGS. 7-8, which are schematic diagrams illustrating a method of forming a semiconductor device according to the second embodiment of the present invention. The formal steps of the present embodiment are substantially similar to those in the aforementioned first preferred embodiment, and may not be redundantly described herein. The differences between the present embodiment and the aforementioned embodiment is mainly in that, a spacer 344a having a tapered profile is formed additionally, to further define the portion of an epitaxial layer 373 protruded from the top surface of the fin structure 320.

Precisely speaking, the spacer 344a of the present embodiment includes a tapered profile for example at the lower portion thereof, as shown in FIG. 7. Otherwise, in another embodiment, the entire spacer may include a continuous tapered profile (not shown in the drawings), but is not limited thereto. Accordingly, a deposition layer 355 deposited on the spacer 344a may conformally have a tapered profile. With this arrangement, the formation of the epitaxial layer 373 may be further limited by the spacer 344a and the deposition layer 355, so that, the tapered sidewall 373b of the gradually shrinking portion 373a may be further tapered, to have a relative greater inclination angle than that of the epitaxial layer 371 in the aforementioned embodiment. Also, a relative greater gap g2 is obtained between the epitaxial layer 373 and the deposition layer 355, as shown in FIG. 7. Following these, the forming processes as shown in FIGS. 3-5 of the aforementioned embodiment is performed, to form a deposition layer 356a at least partially filled the gap g2, and to form an epitaxial layer 374. Then, an etching process is performed to completely remove the deposition layer 356a and the deposition layer 355, and the epitaxial layer 374 and the epitaxial layer 373 may together form an epitaxial structure 370a to configure as the source/drain region of the MOS transistor in the present embodiment.

It is noted that, the epitaxial layer 374 of the present embodiment is also grown from the top surface of the epitaxial layer 373 which is exposed from the deposited layer 356a, to make the entire epitaxial layer 374 being gradually expanded upwardly to perform like a gradually expanding portion. Moreover, the gradually expanding portion includes a tapered sidewall 374b, and the tapered sidewall 374b is continuously tapered along a direction being toward the gate structure 340. That is, the gradually expanding portion may obtain a width (not shown in the drawings) being continuously expanded upwardly, as shown in FIGS. 7-8, namely, with a width W3' of a top surface of the gradually expanding portion (the epitaxial layer 374) being greater than a width W2' both of a bottom surface of the gradually expanding portion and a top surface of the gradually shrinking portion 373a, and with the width W3' of the top surface of the gradually expanding portion being smaller than a width W1' of a bottom surface of the gradually shrinking portion 373a. On the other hand, the epitaxial layer 374 of the present embodiment also has a uniform thickness t2, and the thickness t2 is smaller than a thickness (not shown in the drawings) of the whole of the gradually shrinking portion 373a, and is preferably greater than a thickness (not shown in the drawings) of a portion of the gradually shrinking portion 373a protruded from the top surface of the fin structure 320 (namely the substrate 300) underneath, but not limited thereto.

The epitaxial structure 370a of the present embodiment substantially includes the same features as that of the epitaxial structure 370. precisely, a portion of the epitaxial layer 370a protruded from the top surface of the fin structure 320 (namely the substrate 300) is consisted of the epitaxial layer 374 and a portion of the epitaxial layer 373 (namely a portion of the gradually shrinking portion 373a), and the epitaxial layer 374 and the portion of the epitaxial layer 373 include the continuously tapered sidewalls 374b, 373b respectively. That is, the portion of the epitaxial layer 370 protruded from the top surface of the fin structure 320 may obtain a discontinuous sidewall (not shown in the drawings) thereby. A lower portion of the discontinuous sidewall is namely the sidewall 373b of the epitaxial layer 373 (the gradually shrinking portion 373a), and an upper portion of the discontinuous sidewall is namely the sidewall 374b of the epitaxial layer 374 (namely the gradually expanding portion), as shown in FIG. 8. With this performance, a distance between the adjacent gate structure 340 and a turning point (not shown in the drawings) being between the epitaxial layer 373 (the gradually shrinking portion 373a) and the epitaxial layer 374 (the gradually expanding portion), may be a maximum distance d2 between the epitaxial structure 370a and the adjacent gate structure 340, for example being about 250-270 angstroms. In this way, it is sufficient to further pull apart the distance between the epitaxial layer 370a and the gate structure 340, with the distance between the gate structure 340 and the position of the epitaxial structure 370a adjacent to the top surface of the fin structure 320 being pulled apart by more than 200 angstroms, as shown in FIG. 8.

The portion of the epitaxial structure 370a of the present embodiment protruded from the top surface of the fin structure 320 (namely the substrate 300) has a discontinuous sidewall with a relative greater inclination angle, so that, the distance between the adjacent gate structure 340 and the turning point may be further pull apart. That is, an additional gap g3 is interposed between the epitaxial layer 374 and a portion of the epitaxial layer 373 (namely a portion of the gradually shrinking portion 373a), as shown in FIG. 8. It is noted that, air is easy to remain in the gap g3 while forming the interlayer dielectric layer (not shown in the drawings) on the fin structure 320 (namely the substrate 300) in the subsequent process, so as to form void (not shown in the drawings) in the gap g3 for improving the isolation between the epitaxial structure 370a and the gate structure 340. Then, the semiconductor device of the present embodiment may therefore provide better functions and performances.

Accordingly, the semiconductor device of the second preferred embodiment is obtained. The forming method of the present embodiment uses the tapered profile of the spacer 344a to further define the inclination angle of the portion of the epitaxial layer 373 protruded from the top surface of the substrate 300, to make the sidewall 373b of the epitaxial layer 373 further tapered away from the gate structure 340. That is, the distance between the epitaxial structure 370a and the gate structure 340 may be further pull apart thereby, especially at the position of the epitaxial layer 370a adjacent to the top surface of the substrate 300. In this way, the performance of the semiconductor device may be further improved by avoiding the arrangement of the epitaxial structure 370 getting interference with the current-intensive regions (such as the light doped source/drain region 346) in the substrate 300, at both two sides of the gate structure 340.

Figure 9:
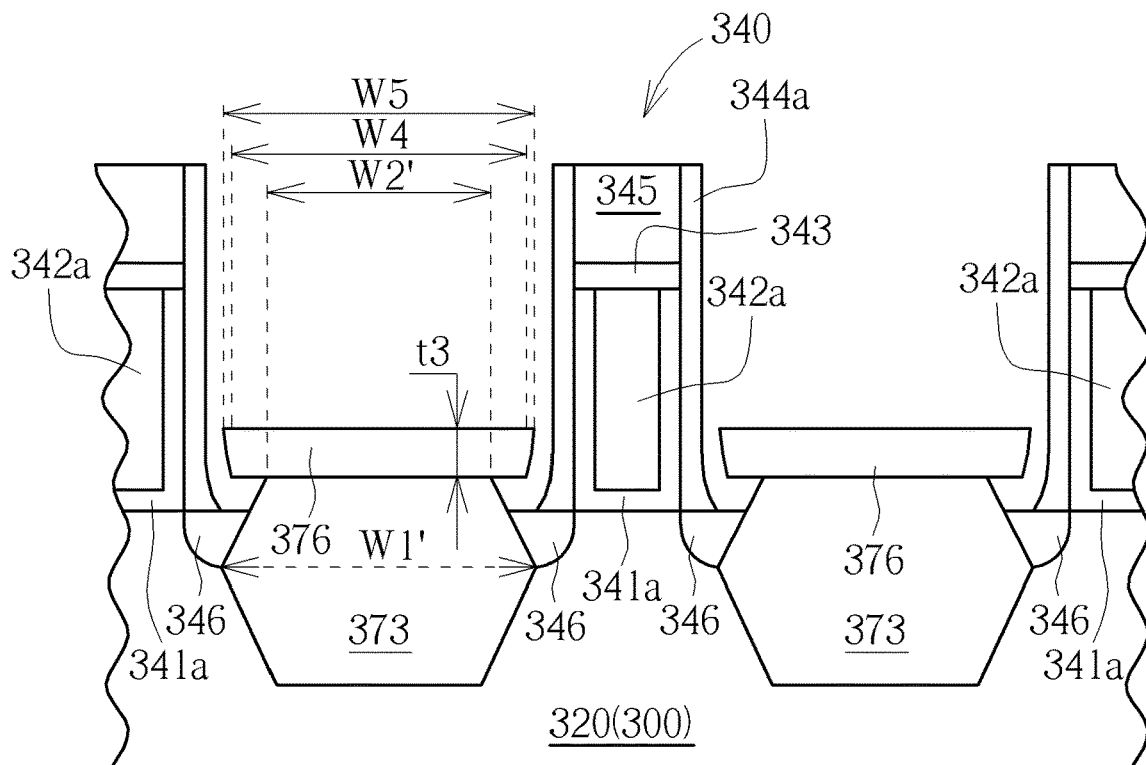
FIG. 9 is a schematic diagram illustrating a semiconductor device according to another preferred embodiment of the present invention.

In addition, although the another SEG process of the aforementioned embodiment is exemplified by forming the epitaxial layer 372/374 upwardly from the top surface of the epitaxial layer 371/373 exposed from the deposition layer 352a/356a, the practical process of the present invention is not limited thereto. In other words, the another SEG process of the present invention may also be performed by simultaneously growing the epitaxy upwardly and laterally from both two sides, to form an epitaxial layer 376 in a suspended platform like shape instead of forming the epitaxial layer 372/374 in a reverse trapezoid shape. The epitaxial layer 376 is suspended disposed on the epitaxial layer 371/373, as shown in FIG. 9, with the epitaxial layer 376 includes a uniform thickness t3. Meanwhile, a bottom surface of a gradually shrinking portion (not shown in the drawings) of the epitaxial layer 373 also has the width W1' being greater than the width W2' of a top surface of the gradually shrinking portion of the epitaxial layer 373, and a bottom surface of the epitaxial layer 376 may have a width W4 being substantially the same or smaller than a width W5 of a top surface of the epitaxial layer 376, with both of the widths W4, W5 being greater than the width W2' and being smaller than the width W1, as shown in FIG. 9.

Figure 10:
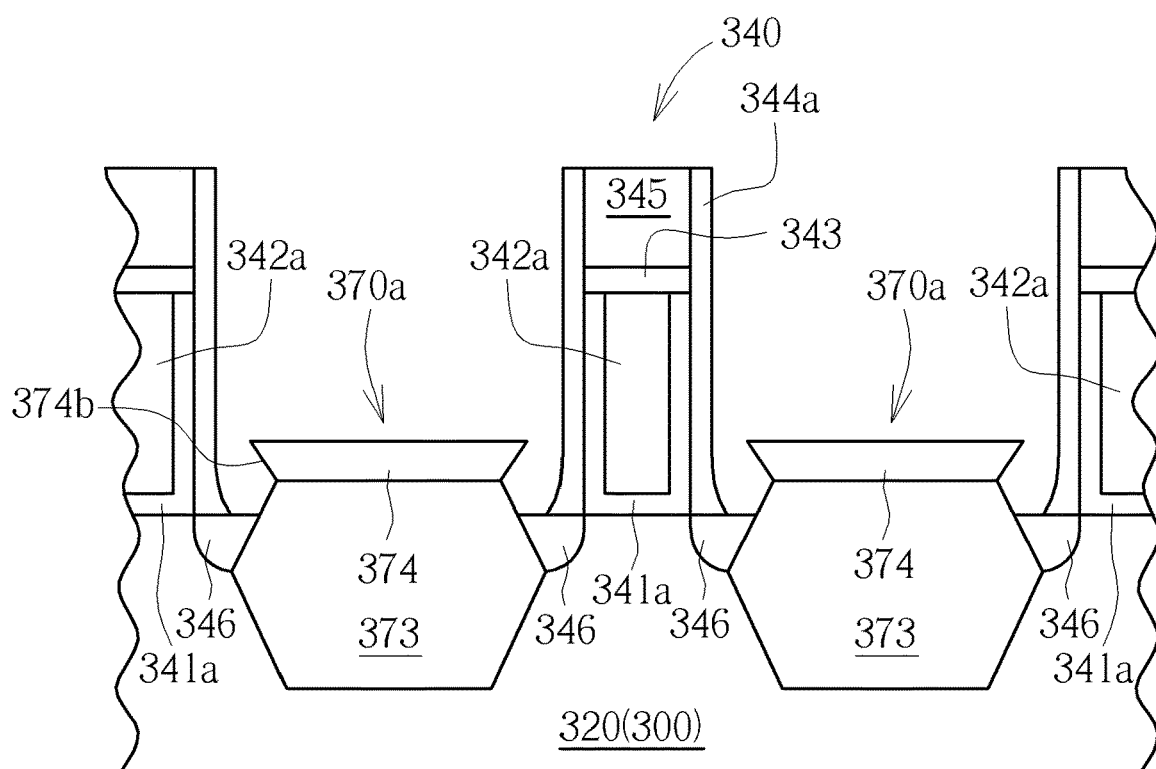
FIG. 10 is a schematic diagram illustrating a method of forming a semiconductor device according to a third preferred embodiment of the present invention.

Please refers to FIG. 10, which is a schematic diagram illustrating a method of forming a semiconductor device according to the third embodiment of the present invention. The formal steps of the present embodiment are substantially similar to those in the aforementioned second preferred embodiment, and may not be redundantly described herein. The differences between the present embodiment and the aforementioned second embodiment is mainly in that, a metal gate structure may be directly formed optionally, while forming the gate structure 340, and the metal gate structure at least includes a high dielectric constant (high-k) layer 314a for example including hafnium oxide ($HfO_2$), hafnium silicon oxide ($HfSiO_4$) or hafnium silicon oxynitride (HfSiON), and a metal gate 3421 for example including a metal material like aluminum (Al), titanium (Ti) or tungsten (W). Otherwise, in another embodiment, a replacement metal gate (RMG) process may be performed additionally after forming the interlayer dielectric layer, to replace the gate layer 342 of the gate structure 340 by a metal gate 342a, as shown in FIG. 10.

Overall speaking, the forming method of the present invention two deposition layers formed in the two deposition processes to respectively define the profile of the portion of the epitaxial structure protruded from the substrate or the fin structure. That is, the portion of the epitaxial structure may therefore obtain a discontinuous sidewall, and a distance between a turning point on the discontinuous sidewall and the adjacent gate structure may be a maximum distance between the epitaxial structure and the gate structure. Preferably, the maximum distance may be adjacent to the top surface of the substrate or the fin structure as much as possible, with the maximum distance being about 200 angstroms or more than 200 angstroms. In this way, it is sufficient to avoid the arrangement of the epitaxial structure getting interference with the current-intensive regions such as a light doped source/drain region in the substrate or the fin structure, at both two sides of the gate structure, so as to gain a better performance and functions to the semiconductor device of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   providing a substrate;
   forming a gate structure on the substrate;
   forming a first epitaxial layer;
   forming a multilayer deposition structure on sidewalls of the gate structure, wherein the multilayer deposition structure comprises a spacer, a first deposition layer and a second deposition stacked sequentially on the sidewalls of the gate structure; and
   after partially removing the multilayer deposition structure, forming a second epitaxial layer on the first epitaxial layer, wherein forming the second epitaxial layer comprises:
      partially removing the second deposition layer, to form a third deposition layer having a top surface being coplanar with a top surface of the first epitaxial layer; and
      forming the second epitaxial layer.

2. The method of forming the semiconductor device according to claim 1, wherein a bottom surface of the second epitaxial layer is equal to the top surface of the first epitaxial layer.

3. The method of forming the semiconductor device according to claim 1, further comprising:
   after forming the second epitaxial layer, removing the third deposition layer and the first deposition layer.

4. The method of forming the semiconductor device according to claim 1, wherein each of the spacer and the first deposition layer comprise a tapered sidewall.

5. The method of forming the semiconductor device according to claim 4, wherein a bottom surface of the second epitaxial layer is equal to the top surface of the first epitaxial layer.

6. The method of forming the semiconductor device according to claim 4, wherein two opposite ends of second epitaxial layer are not extended over two opposite ends of the first epitaxial layer in a horizontal direction.

7. The method of forming the semiconductor device according to claim 4, wherein the forming of the second epitaxial layer comprises:
   completely removing the first deposition layer.

8. The method of forming the semiconductor device according to claim 7, wherein the second epitaxial layer comprises a suspended platform.

9. The method of forming the semiconductor device according to claim 7, wherein a bottom surface of the second epitaxial layer is larger than a top surface of the first epitaxial layer.

10. The method of forming the semiconductor device according to claim 7, wherein two opposite ends of second epitaxial layer are vertically aligned with two opposite ends of the first epitaxial layer.

11. The method of forming the semiconductor device according to claim 1, wherein a portion of the multilayer deposition structure is formed before forming the first epitaxial layer, and another portion of the multilayer deposition structure is formed after forming the first epitaxial layer.

12. The method of forming the semiconductor device according to claim 11, wherein the another portion of the multilayer deposition structure comprises the second deposition layer.

* * * * *